United States Patent
Bonilla et al.

(10) Patent No.: US 7,776,737 B2
(45) Date of Patent: Aug. 17, 2010

(54) RELIABILITY OF WIDE INTERCONNECTS

(75) Inventors: Griselda Bonilla, Fishkill, NY (US);
Kaushik Chanda, Fishkill, NY (US);
Ronald G. Filippi, Wappingers Falls, NY (US); Stephan Grunow, Poughkeepsie, NY (US); Sujatha Sankaran, New Paltz, NY (US); Andrew H. Simon, Fishkill, NY (US); Theodorus Eduardus Standaert, Pine Bush, NY (US)

(73) Assignee: International Business Machines Corporation, Armonk, NY (US)

( * ) Notice: Subject to any disclaimer, the term of this patent is extended or adjusted under 35 U.S.C. 154(b) by 175 days.

(21) Appl. No.: 12/191,534

(22) Filed: Aug. 14, 2008

(65) Prior Publication Data

US 2010/0038790 A1 Feb. 18, 2010

(51) Int. Cl.
H01L 21/4763 (2006.01)
H01L 23/48 (2006.01)
H01L 23/52 (2006.01)
H01L 29/40 (2006.01)
(52) U.S. Cl. .......... 438/622; 257/758; 257/E21.575
(58) Field of Classification Search ............. 257/758, 257/E21.575; 438/622, 758
See application file for complete search history.

(56) References Cited

U.S. PATENT DOCUMENTS

| 6,686,279 | B2 | 2/2004 | Yen et al. |
| 6,884,710 | B2 | 4/2005 | Park et al. |
| 7,138,714 | B2 | 11/2006 | Nguyen et al. |
| 2008/0012142 | A1* | 1/2008 | Mehta et al. ............. 257/762 |
| 2010/0068880 | A1* | 3/2010 | Hatanaka et al. ......... 438/627 |

* cited by examiner

*Primary Examiner*—David S Blum
(74) *Attorney, Agent, or Firm*—Lisa V. Jaklitsch; Katherine S. Brown; Ira D. Blecker

(57) ABSTRACT

An integrated circuit which includes a semiconductor substrate, a first metal wiring level on the semiconductor substrate which includes metal wiring lines, an interconnect wiring level on the first metal wiring level which includes a via interconnect within an interlevel dielectric, a second metal wiring level on the interconnect wiring level which includes metal wiring lines, at least one metal wiring line having a plurality of dielectric fill shapes that reduces the cross sectional area of the at least one metal wiring line, and wherein the via interconnect makes electrical contact between a metal line in the first wiring level and the at least one metal wiring line in the second wiring level, the via interconnect being adjacent to and spaced from the plurality of dielectric fill shapes. Also disclosed is a method in which a plurality of dielectric fill shapes are placed adjacent to and spaced from a via contact area in a wiring line in a second wiring level.

25 Claims, 2 Drawing Sheets

RELIABILITY OF WIDE INTERCONNECTS

BACKGROUND OF THE INVENTION

The present invention relates to the field of semiconductor processing and, more particularly, to the processing of semiconductors having wide metal wiring lines.

Generally, semiconductor devices include a plurality of integrated circuits (ICs). ICs can be useful for many applications including computers and electronic equipment and they can contain millions of transistors and other circuit elements that can be fabricated on a single semiconductor chip. For device functionality, a complex of signal paths will typically be routed to connect the circuit elements distributed on the surface of the semiconductor device. Efficient routing of these signals across the device can become more difficult as the complexity and number of ICs is increased. Thus, the formation of multi-level or multi-layered interconnect schemes have become more desirable due to their efficiency in providing high-speed signal routing patterns between a large number of transistors on a single semiconductor chip. The preferred interconnect metal is copper.

In fabricating IC wiring with a multi-level scheme, an insulating material (oftentimes referred to as a dielectric material) such as silicon dioxide ($SiO_2$), will normally be patterned to provide trenches that are subsequently filled with conductive material to provide metal lines for electrical connectivity. Prior to the deposition of the conductive material, a conformal diffusion barrier, often referred as a liner, is formed along the base and sidewalls of the trench. Following the formation of the diffusion barrier, a metal, such as copper, is deposited within the trench and planarized to provide metal lines. The foregoing method of patterning and filling trenches is referred to as a single damascene process.

A dielectric layer is then blanket deposited atop the metal lines and the insulating material. The dielectric layer is then normally patterned to create openings for conductive lines and/or vias using photolithography and etching. A diffusion barrier (liner) is then formed along the sidewalls and the base of the via and a metal, such as copper, is deposited within the vias to be in electrical contact with the metal line, as discussed above. The diffusion barrier material typically comprises tantalum nitride and/or tantalum. The foregoing method of patterning and filling conductive lines and vias is referred to as a dual damascene process.

Copper, despite having a low resistance suitable for electrical connectivity in high-speed devices, is susceptible to electromigration. Contrary to copper, tantalum or tantalum nitride is substantially less susceptible to electromigration and serves as a barrier for copper diffusion.

Reliability of copper interconnects is usually limited by failure mechanisms such as electromigration (EM) and stress migration (SM). In EM, copper atoms migrate in the direction of the electron flow, eventually causing a void in the copper lines. In SM, copper atoms diffuse to relieve the thermal stress caused by the mismatch in the coefficient of thermal expansion (CTE) between the copper and the surrounding dielectric. Here, void formation is also possible if sufficient vacancies are available. For dual damascene processing, in which the vias and metal lines are formed in the same step, liner materials are used for improved yield and reliability. That is, if voids are present in the copper vias or metal lines, an open circuit is prevented by having a current path through the conductive liners. As noted above, these liner materials are typically tantalum nitride and/or tantalum.

Interconnect structures with a via landing on a wide metal line typically show the poorest EM reliability. In this case, the via fails to make contact with the tantalum-based liners of the metal line below. Once the EM induced void grows across the base of the via, no metallic liner exists that can act as a redundant pathway for the current and the structure electrically goes open. Hence, this structure shows a low median time to fail. The same problem exists for SM in which a single via lands on a large metal plate.

The EM and SM reliability of such structures are improved when the depth the via gouges into the line below is increased. The liner etchback process causes via gouging, where an argon sputter etch removes liner material from the bottom of the via and also etches into the metal line below the via. An increase in liner etchback produces more via gouging/recess into the underlying metal line. With gouging, the resulting larger contact area requires a larger void, and thus longer time, before the structure fails. Non-gouged vias have an interface under high tensile strain due to thermal stress. By gouging the via, the interface is enlarged, lowering the stress density and also partially transforming the tensile component into a shear component (flat surface versus arched surface). The yield strength for shear stress along the copper-tantalum-copper interface may be higher than for tensile stress, raising the threshold for SM failure. However, attempting to increase via gouging into the line below has drawbacks. Due to the dual damascene nature, the process of increasing via gouging removes liner from the bottom of the trench (or metal line) above the via. This results in additional reliability issues like time dependent dielectric breakdown (TDDB), especially with low dielectric constant (low-k) materials.

Yen et al. U.S. Pat. No. 6,686,279, Park et al. U.S. Pat. No. 6,884,710 and Mehta et al. U.S. Patent Application Publication US 2008/0012142, the disclosures of which are incorporated by reference herein, disclose gouging in general.

Nguyen et al. U.S. Pat. No. 7,138,714, the disclosure of which is incorporated by reference herein, discloses using dielectric fill shapes for improved EM reliability. However, Nguyen et al. pertains to a wide metal line below the via only. The dielectric fill shapes are placed in the line below the via so as to provide liner redundancy during EM testing. The main intention of Nguyen et al. is to make the via liner touch the liner of the metal line below, by either notching the line below or introducing dielectric islands in the line below. The dielectric fill shapes need to make contact with the via in order to obtain reliability benefits.

BRIEF SUMMARY OF THE INVENTION

According to the present invention, there is disclosed in a first embodiment an integrated circuit comprising:
    a semiconductor substrate;
    a first metal wiring level on the semiconductor substrate comprising metal wiring lines;
    an interconnect wiring level on the first metal wiring level comprising a via interconnect within an interlevel dielectric;
    a second metal wiring level on the interconnect wiring level comprising metal wiring lines, at least one metal wiring line having a plurality of dielectric fill shapes that reduces the cross sectional area of the at least one metal wiring line; and
    wherein the via interconnect makes electrical contact between a metal line in the first wiring level and the at least one metal wiring line in the second wiring level, the via interconnect being adjacent to and spaced from the plurality of dielectric fill shapes.

According to a second embodiment of the invention, there is disclosed an integrated circuit comprising:
    a semiconductor substrate;

a first metal wiring level on the semiconductor substrate comprising metal wiring lines;

an interconnect wiring level on the first metal wiring level comprising a via interconnect within an interlevel dielectric;

a second metal wiring level on the interconnect wiring level comprising metal wiring lines, at least one metal wiring line having a via contact area and a plurality of dielectric fill shapes adjacent to and spaced from the via contact area;

wherein the via interconnect makes electrical contact between a metal line in the first wiring level and the via contact area of the at least one metal wiring line in the second wiring level.

According to a third embodiment of the invention, there is disclosed an integrated circuit comprising:

a semiconductor substrate;

a first metal wiring level on the semiconductor substrate comprising metal wiring lines;

an interconnect wiring level on the first metal wiring level comprising via interconnects within an interlevel dielectric;

a second metal wiring level on the interconnect wiring level comprising metal wiring lines, a first group of the metal wiring lines having a via contact area and a plurality of dielectric fill shapes adjacent to and spaced from the via contact area and a second group of the metal wiring lines having a via contact area and no dielectric fill shapes;

wherein the via interconnects make electrical contact between metal wiring lines in the first wiring level and the via contact areas of the first and second group of metal wiring lines in the second wiring level; and wherein the via interconnects contacting the first group of the metal wiring lines in the second metal wiring level gouge the metal lines of the first wiring level a first amount and the via interconnects contacting the second group of the metal wiring lines in the second metal wiring level gouge the metal lines of the first wiring level a second amount such that the first and the second amounts are approximately the same.

According to a fourth embodiment of the invention, there is disclosed a method of improving reliability of interconnects comprising the steps of:

obtaining a semiconductor substrate having a first metal wiring level on the semiconductor substrate comprising metal wiring lines, an interconnect wiring level on the first metal wiring level comprising a via interconnect within an interlevel dielectric, and a second metal wiring level on the interconnect wiring level comprising metal wiring lines, at least one metal wiring line having a via contact area;

placing a plurality of dielectric fill shapes adjacent to and spaced from the via contact area in the at least one metal wiring line in the second wiring level; and electrically interconnecting a metal line in the first wiring level and the via contact area of the at least one metal wiring line in the second wiring level.

BRIEF DESCRIPTION OF THE DRAWINGS

The features of the invention believed to be novel and the elements characteristic of the invention are set forth with particularity in the appended claims. The Figures are for illustration purposes only and are not drawn to scale. The invention itself, however, both as to organization and method of operation, may best be understood by reference to the detailed description which follows taken in conjunction with the accompanying drawings in which:

DETAILED DESCRIPTION OF THE INVENTION

Figure 1A:
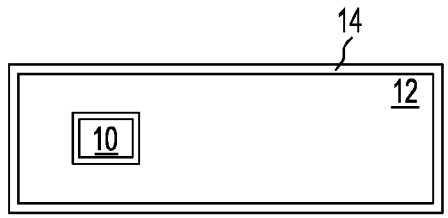
FIGS. 1A and 1B illustrate a prior art via structure on a wide line or a narrow line, respectively.
Figure 1B:
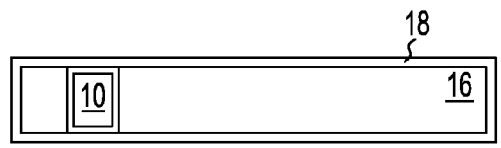

Referring to FIG. 1A, when a single via 10 lands on a wide metal line 12, it does not make contact with the metallic liners 14 of the wide metal line 12. Once an EM-induced void grows across the base of the via 10, the structure electrically opens. On the other hand, a via 10 landing on a narrow metal line 16 maintains electrical continuity even after the void has grown across the via due to its contact with the liner 18 of the narrow metal line below as shown in FIG. 1B. In a comparison of the resistance versus time, the structure in FIG. 1A experiences a "pop-open" fail while the structure in FIG. 1B experiences only a gradual increase in resistance wherein current is conducted through the liner. The structure in FIG. 1B, with liner redundancy, shows a longer median time to fail.

Figure 2A:
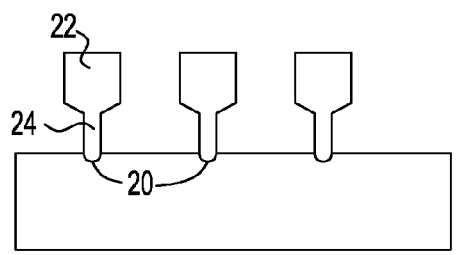
FIGS. 2A and 2B illustrate prior art via gouging wherein the via has narrow line above it or a wide line above, respectively.
Figure 2B:
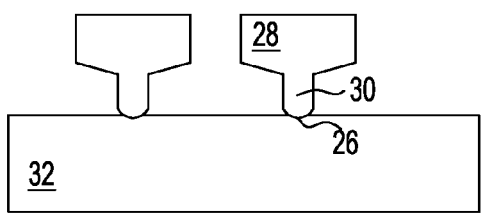

The depth the via gouges into the line below depends on the size of the feature above the via, as shown in FIGS. 2A and 2B, which is a consequence of the fact that the etchback process shows more directionality and therefore increased gouging depth for small features. FIG. 2A shows typical via gouging 20 for a narrow metal line 22 above the via 24. On the other hand, negligible or minimal gouging 26 occurs when large features 28 (e.g., wide metal lines) are above the via 30, which leads to stress migration failures in plate 32 below the via structures 30.

The problem is that the via gouging process is usually defined for narrow features above a minimum size via as shown in FIG. 2A. This means that negligible or minimal via gouging will occur when very wide features are above a minimum size via as shown in FIG. 2B. It would be beneficial to have a set of design rules that could be implemented to produce nearly the same via gouging depth for narrow and wide features, which would increase EM as well as SM lifetimes.

The present invention provides design layout rules for such cases as shown in FIGS. 2A and 2B that locally modify the interconnect in the vicinity of the via. The EM and SM reliability of wide metal lines can be enhanced by putting dielectric fill shapes near the via in the line above. Addition of the dielectric fill shapes to the metal line above locally "shrinks" the line. This local reduction in width of the metal line above the via leads to greater via gouging into the metal line underneath. Increased via gouging improves the EM reliability of structures with single vias landing on wide metal lines as well as the SM reliability of metal plate below via structures. Implementation of these shapes neither requires any special process steps, nor adversely affects the electrical resistance of the interconnects. This results in robust EM and SM reliability without any trade-offs. Furthermore, with the present invention, aggressive gouging is not required so that damage to the trench bottom is limited and hence greater TDDB reliability is obtained.

Figure 3:
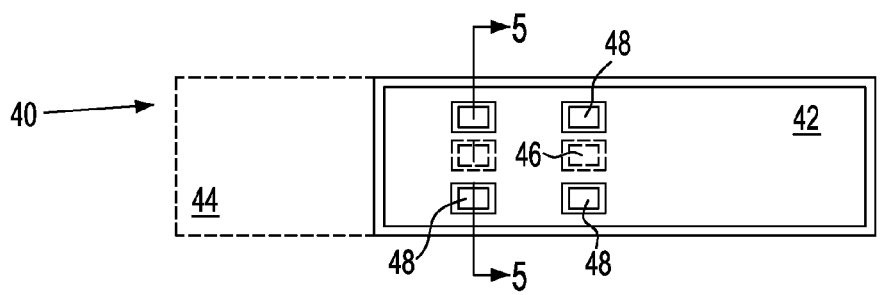
FIGS. 3 and 4A to 4D illustrate a via structure according to the present invention wherein there is a wide line above the via.
Figure 5:
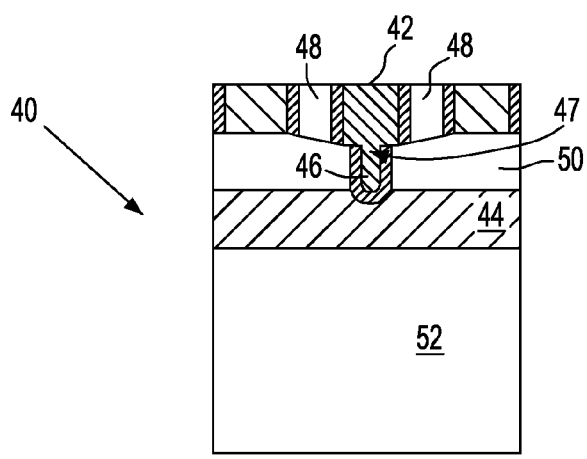
FIG. 5 is an enlarged cross section view of the via structure of FIG. 3 in the direction of arrows 5-5.

Referring now to FIGS. 3 and 5, there is shown one exemplary embodiment of the present invention. Shown in FIGS. 3 and 5 is a portion of an integrated circuit 40 having a semiconductor substrate 52 upon which is situated a first metal wiring level represented by metal wiring line 44, an interconnect wiring level 50 having vias 46 (vias 46 may also be referred to hereafter as via interconnects) therein and a second metal wiring level represented by metal wiring line 42. Wiring line 44 can be a wide metal wiring line or a narrow metal wiring line but the maximum benefit of the invention will be attained for wide metal lines. The first and second wiring levels are those in the so-called back end of the line and typically there will be several such wiring levels. There may be one or more wiring levels before the first wiring level shown in FIG. 5 and similarly there may be one or more wiring levels after the second wiring level shown in FIG. 5. The transistors and other electronic components comprise the semiconductor substrate 52. The vias 46 make electrical as well as physical contact between the metal wiring line 44 in the first metal wiring level and metal wiring 42 in the second metal wiring level. The metal wiring line 42 has a plurality of dielectric fill shapes 48 that reduce the cross sectional area of the metal wiring line 42. In the particular exemplary embodiment shown in FIGS. 3 and 5, the dielectric fill shapes 48 are situated along the width of the metal wiring line 42. Importantly, the vias 46 are adjacent to and spaced from the dielectric fill shapes 48. The dielectric fill shapes 48 are approximately equally spaced from the vias 46. It should be apparent from comparing FIGS. 3 and 5 that the dielectric fill shapes 48 and vias 46 are on different levels. Where the vias 46 meet the metal wiring 42 could be called the via contact area 47 as shown in FIG. 5. The dielectric fill shapes actually are arranged around that via contact area 47. This same analogy applies to FIGS. 4A through 4D as well.

One embodiment only of the present invention has been shown in FIGS. 3 and 5. It should be understood that the configuration of the dielectric fill shapes 48 can take other forms, as will be demonstrated with respect to FIGS. 4A through 4D.

Figure 4A:
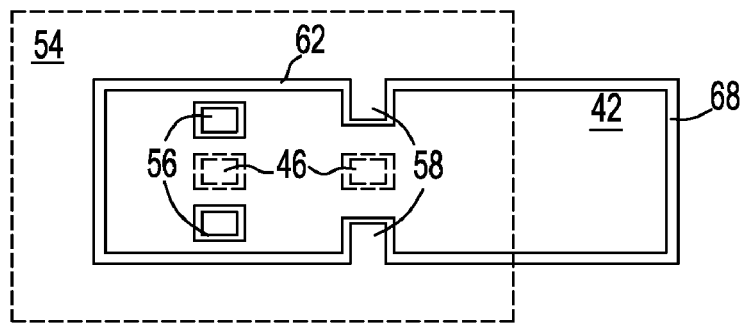

Referring now to FIGS. 4A through 4D, there are shown additional embodiments of the present invention. FIGS. 4A through 4D differ from FIGS. 3 and 5 in that the metal wiring line in the first wiring level is metal plate 54. Metal plate 54 may also be referred to in the art as metal wiring line. Referring now to FIG. 4A, the vias 46 in the interconnect wiring level 50 of FIG. 5 again make electrical contact between the metal plate 54 and metal wiring line 42. Within metal wiring line 42, there are a plurality of dielectric fill shapes 56 which are adjacent to and spaced from vias 46 as was the case with respect to the structure shown in FIG. 3. Further, in the embodiment shown in FIG. 4A, the dielectric fill shapes also are situated along the width of the metal wiring line 42. It should be noted that dielectric fill shapes 56 are spaced from the edge 62 of metal wiring line 42. The dielectric fill shapes alternatively can also be configured as to be right at the edge 62 of the metal wiring line 42 so as to give the metal wiring line 42 a notched shape. This is the case with dielectric fill shapes 58. The diffusion barrier 68 of the metal wiring line 42 would follow around the dielectric fill shapes 58 instead of being between the dielectric fill shapes and edge 62 as was the case with dielectric fill shapes 58.

Figure 4B:
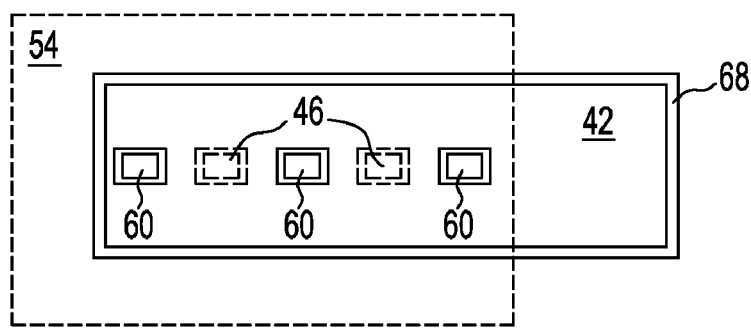

Referring now to FIG. 4B, this embodiment is very similar to the embodiment shown in FIG. 4A except that the dielectric fill shapes 60 are situated along the length of the metal wiring line 42. As before, the dielectric fill shapes 60 are on opposite sides of the vias 46 and approximately equally spaced from the vias 46.

Figure 4C:
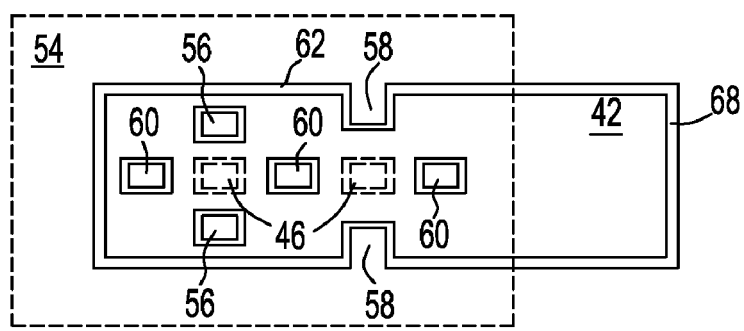

In a further embodiment of the present invention, the dielectric fill shapes can be located both along the width and along the length of the metal wiring line 42, essentially a combination of FIGS. 4A and 4B. Thus, as shown in FIG. 4C, dielectric fill shapes 56 are situated along the width of the metal wiring line 42 but also spaced from the edge 62 of the metal wiring line 42. Dielectric fill shapes 58 are also situated along the width of the metal wiring line 42 but in this case, the dielectric fill shapes 58 are located at the edge 62 of the metal wiring line 42. Lastly, dielectric fill shapes 60 are situated along the length of the metal wiring line 42.

Figure 4D:
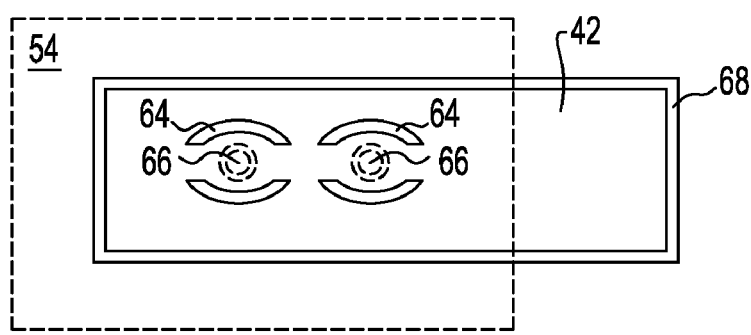

The issue of shape dictates that the dielectric fill shapes 56, 58, 60 maintain a constant spacing from the vias 46 for as much of the via periphery as possible. Otherwise, a via-first reactive ion etching (RIE) integration, in which the via openings are formed before the line openings, will probably lead to flaring of the feature outwards in areas without fill shapes, once the sputter etch is done (maybe even after RIE is done). The rectangular, usually square, vias shown in FIGS. 3, 4A, 4B and 4C actually can become round after lithography, so it might be necessary to consider an annular-shaped dielectric fill shape at constant spacing to cover circular vias. FIG. 4D shows an example of annular-shaped dielectric fill shapes 64 adjacent to and spaced from circular vias 66 that would prevent large sidewall angles in circular vias 66.

Based on the foregoing discussion, a set of design rules for proper layout of the dielectric fill shapes can be developed. It is known that weak gouging occurs when a 3×-4× wide line is above a 1× diameter via (i.e., the wide line is approximately 3 to 4 times the width or diameter of the via whereas a 1× line is approximately same width or diameter of the via). This implies a via sidewall angle of roughly 30 degrees (relative to vertical). Therefore, the target geometries should cut that angle by 50%. This corresponds to geometries in which a 2× wide line is above a 1× diameter via. Covering the process window broadly, the maximum spacing of the dielectric fill shape relative to the via would be approximately 1× the via width or diameter. The minimum spacing of the fill shape could be pretty small to cover most possibilities, about 0.1 times the via width or diameter. It should also be noted that during design, vias are drawn as squares but in actuality the vias have a near-circular cross section whose diameter is the same as the edge of the square. Hence the fill shapes should have a proximity of $$d > \text{Spacing between via and dielectric fill shape} > 0.1d$$

where d=the via diameter or via width for the sidewall-angle engineering to help give the proper gouging.

The resistance of the proposed structure should not be adversely impacted since a conduction path still remains in the metal line between the dielectric region and the via. Therefore, the structure maintains the necessary resistance while at the same time provides reliability benefits. The inventive structure will include gouging of the via into the underlying conductive layer, but will also include dielectric fill shapes in the line above the via. These two features allow for a more uniform via gouging depth that is relatively independent of the linewidth above the via.

The proposed invention provides for a more uniform via gouging profile across a wafer. The invention relies on dielectric fill shapes to be placed in wide lines above vias to locally reduce the feature size for improved via recess into the underlying line. This allows for enhanced EM reliability of structures with single vias landing on wide lines as well as SM reliability of plate or wiring below via structures. Design rules can be implemented such that the via gouging depth is relatively independent of the linewidth above the via. In this manner, via gouging depth in the underlying metal line can be approximately the same for wide lines above the vias as well as narrow width lines above the via.

The prior art as noted above pertains to different methods of gouging. None of the prior art discloses placing dielectric fill shapes in the metal line above a via in order to increase the gouging depth into the metal line below the via. Further, to the extent the prior art discloses dielectric fill shapes, the dielectric fill shapes are in the metal line below the via and the dielectric fill shapes need to make contact with the via in order to obtain reliability benefits, unlike the present invention in which contact is not required to obtain reliability benefits. The present invention modifies the local geometry of the metal line above the via to mimic that of a narrow metal line which allows for greater gouging of the via into the underlying metal line. Further, the prior art was restricted to wide metal lines below the via whereas the present invention is not restricted to wide metal lines below the via. The EM reliability of minimum width metal lines can also be improved by the structure and method of the present invention.

There is also disclosed a method of improving reliability of interconnects according to the present invention. The first step of the invention comprises obtaining a semiconductor substrate having a first metal wiring level on the semiconductor substrate comprising metal wiring lines, an interconnect wiring level on the first metal wiring level comprising a via interconnect within an interlevel dielectric, and a second metal wiring level on the interconnect wiring level comprising metal wiring lines, at least one metal wiring line having a via contact area.

The next step of the method comprises placing a plurality of dielectric fill shapes adjacent to and spaced from the via contact area in the at least one metal wiring line in the second wiring level.

The last step of the method comprises electrically interconnecting a metal line in the first wiring level and the via contact area of the at least one metal wiring line in the second wiring level.

As in the previous embodiments of the present invention, the dielectric fill shapes can be situated along the width or length or width and length of the at least one metal wiring line. The dielectric fill shapes should be on opposite sides of the via contact area.

It will be apparent to those skilled in the art having regard to this disclosure that other modifications of this invention beyond those embodiments specifically described here may be made without departing from the spirit of the invention. Accordingly, such modifications are considered within the scope of the invention as limited solely by the appended claims.

The invention claimed is:
1. An integrated circuit comprising:
a semiconductor substrate;
a first metal wiring level on the semiconductor substrate comprising metal wiring lines;
an interconnect wiring level on the first metal wiring level comprising a via interconnect within an interlevel dielectric;
a second metal wiring level on the interconnect wiring level comprising metal wiring lines, at least one metal wiring line having a plurality of dielectric fill shapes that reduces the cross sectional area of the at least one metal wiring line; and
wherein the via interconnect makes electrical contact between a metal line in the first wiring level and the at least one metal wiring line in the second wiring level, the via interconnect being adjacent to and spaced from the plurality of dielectric fill shapes.

2. An integrated circuit comprising:
a semiconductor substrate;
a first metal wiring level on the semiconductor substrate comprising metal wiring lines;
an interconnect wiring level on the first metal wiring level comprising a via interconnect within an interlevel dielectric;
a second metal wiring level on the interconnect wiring level comprising metal wiring lines, at least one metal wiring line having a via contact area and a plurality of dielectric fill shapes adjacent to and spaced from the via contact area;
wherein the via interconnect makes electrical contact between a metal line in the first wiring level and the via contact area of the at least one metal wiring line in the second wiring level.

3. The integrated circuit of claim 2 wherein the plurality of dielectric fill shapes are situated along the width of the at least one metal wiring line.

4. The integrated circuit of claim 2 wherein the plurality of dielectric fill shapes are situated along the length of the at least one metal wiring line.

5. The integrated circuit of claim 2 wherein the plurality of dielectric fill shapes are situated along the width and length of the at least one metal wiring line.

6. The integrated circuit of claim 2 wherein there is at least one dielectric fill shape on opposite sides of the via contact area.

7. The integrated circuit of claim 2 wherein the dielectric fill shapes are rectangular.

8. The integrated circuit of claim 2 wherein the dielectric fill shapes are annular shaped.

9. The integrated circuit of claim 2 wherein the via interconnect gouges the first metal wiring level.

10. The integrated circuit of claim 2 wherein the at least one metal wiring line in the second wiring level is a wide metal wiring line.

11. The integrated circuit of claim 10 wherein the via interconnect makes electrical contact with a wide metal wiring line in the first metal wiring level and wherein the via interconnect has a diameter or width and the wide metal wiring line has a width such that the width of the wide metal wiring line is about 3 to 4 times the diameter or width of the via interconnect.

12. The integrated circuit of claim 2 wherein the via interconnect has a diameter or width and wherein there is a minimum spacing between the via contact area and the plurality of dielectric fill shapes in the range of 0.1 to 1.0 times the diameter or width of the via interconnect.

13. An integrated circuit comprising:
a semiconductor substrate;
a first metal wiring level on the semiconductor substrate comprising metal wiring lines;
an interconnect wiring level on the first metal wiring level comprising via interconnects within an interlevel dielectric;
a second metal wiring level on the interconnect wiring level comprising metal wiring lines, a first group of the metal wiring lines having a via contact area and a plurality of dielectric fill shapes adjacent to and spaced from the via contact area and a second group of the metal wiring lines having a via contact area and no dielectric fill shapes;
wherein the via interconnects make electrical contact between metal wiring lines in the first wiring level and the via contact areas of the first and second group of metal wiring lines in the second wiring level; and
wherein the via interconnects contacting the first group of the metal wiring lines in the second metal wiring level gouge the metal lines of the first wiring level a first amount and the via interconnects contacting the second group of the metal wiring lines in the second metal wiring level gouge the metal lines of the first wiring level a second amount such that the first and the second amounts are approximately the same.

14. The integrated circuit of claim 13 wherein the plurality of dielectric fill shapes are situated along the width of the at least one metal wiring line.

15. The integrated circuit of claim 13 wherein the plurality of dielectric fill shapes are situated along the length of the at least one metal wiring line.

16. The integrated circuit of claim 13 wherein the plurality of dielectric fill shapes are situated along the width and length of the at least one metal wiring line.

17. The integrated circuit of claim 13 wherein there is at least one dielectric fill shape on opposite sides of the via contact area.

18. The integrated circuit of claim 13 wherein the first group of the metal wiring lines in the second level have a width which is greater than a width of the second group of the metal wiring lines in the second level.

19. The integrated circuit of claim 18 wherein the via interconnects that make electrical contact with the first group of the metal wiring lines in the second level make electrical contact with wide metal wiring lines in the first metal wiring level.

20. A method of improving reliability of interconnects comprising the steps of:

obtaining a semiconductor substrate having a first metal wiring level on the semiconductor substrate comprising metal wiring lines, an interconnect wiring level on the first metal wiring level comprising a via interconnect within an interlevel dielectric, and a second metal wiring level on the interconnect wiring level comprising metal wiring lines, at least one metal wiring line having a via contact area;

placing a plurality of dielectric fill shapes adjacent to and spaced from the via contact area in the at least one metal wiring line in the second wiring level; and electrically interconnecting a metal line in the first wiring level and the via contact area of the at least one metal wiring line in the second wiring level.

21. The method of claim 20 wherein the plurality of dielectric fill shapes are situated along the width of the at least one metal wiring line.

22. The method of claim 20 wherein the plurality of dielectric fill shapes are situated along the length of the at least one metal wiring line.

23. The method of claim 20 wherein the plurality of dielectric fill shapes are situated along the width and length of the at least one metal wiring line.

24. The method of claim 20 wherein there is at least one dielectric fill shape on opposite sides of the via contact area.

25. The method of claim 20 wherein the via interconnect gouges the first metal wiring level.

* * * * *